(12) United States Patent  
Hosotani

(10) Patent No.: US 12,193,143 B2
(45) Date of Patent: Jan. 7, 2025

(54) CIRCUIT BOARD MODULE

(71) Applicant: Murata Manufacturing Co., Ltd., Kyoto-fu (JP)

(72) Inventor: Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 200 days.

(21) Appl. No.: 17/933,114

(22) Filed: Sep. 18, 2022

(65) Prior Publication Data

US 2023/0011922 A1 Jan. 12, 2023

Related U.S. Application Data

(63) Continuation of application No. PCT/JP2020/039759, filed on Oct. 22, 2020.

(30) Foreign Application Priority Data

Mar. 18, 2020 (JP) .................. 2020-047122

(51) Int. Cl.
*H05K 1/00* (2006.01)
*G06F 1/20* (2006.01)
(Continued)

(52) U.S. Cl.
CPC .......... *H05K 1/0203* (2013.01); *G06F 1/206* (2013.01); *H01L 23/3675* (2013.01);
(Continued)

(58) Field of Classification Search
CPC .... H05K 1/0203; H05K 1/144; H05K 7/2039; H05K 7/209; H05K 2201/1003;
(Continued)

(56) References Cited

U.S. PATENT DOCUMENTS

2005/0189566 A1* 9/2005 Matsumoto ............ H05K 3/368
257/200
2006/0268527 A1* 11/2006 Tanaka ................... H05K 3/284
361/720
(Continued)

FOREIGN PATENT DOCUMENTS

JP 2004-235402 A 8/2004
JP 2010-141279 A 6/2010
(Continued)

OTHER PUBLICATIONS

International Search Report issued in PCT/JP2020/039759; mailed Dec. 22, 2020.

*Primary Examiner* — Mandeep S Buttar
(74) *Attorney, Agent, or Firm* — Studebaker & Brackett PC

(57) ABSTRACT

A first circuit board includes a positive output pin and a negative output pin of a power conversion circuit, each of which has a shape projecting from a second main surface. A second circuit board has a positive through via and a negative through via, each of which has a shape extending between a third main surface and a fourth main surface. The second main surface of the first circuit board and the third main surface of the second circuit board are physically in close contact with each other. The positive output pin is inserted through the positive through via to reach the fourth main surface. The negative output pin is inserted through the negative through via in such a manner as to reach the fourth main surface. The load receives a current supplied from the power conversion circuit through the positive output pin and the negative output pin.

20 Claims, 7 Drawing Sheets

(51) Int. Cl.
   *H01L 23/367*   (2006.01)
   *H01L 23/373*   (2006.01)
   *H01L 25/16*    (2023.01)
   *H05K 1/02*     (2006.01)
   *H05K 1/14*     (2006.01)
   *H05K 7/20*     (2006.01)

(52) U.S. Cl.
   CPC ........ *H01L 23/3737* (2013.01); *H01L 25/162* (2013.01); *H05K 1/144* (2013.01); *H05K 7/2039* (2013.01); *H05K 7/209* (2013.01); *H05K 2201/042* (2013.01); *H05K 2201/1003* (2013.01); *H05K 2201/10378* (2013.01)

(58) Field of Classification Search
   CPC .......... H05K 2201/10378; G06F 1/206; H01L 23/3675; H01L 25/162
   USPC ........ 361/719, 720, 785, 790, 601, 704, 715
   See application file for complete search history.

(56) References Cited

U.S. PATENT DOCUMENTS

| | | | |
|---|---|---|---|
| 2010/0225126 A1* | 9/2010 | Chiang | A61P 31/14 292/164 |
| 2015/0373836 A1* | 12/2015 | Masutani | H01L 25/07 361/783 |
| 2023/0354528 A1* | 11/2023 | Doi | H05K 3/36 |

FOREIGN PATENT DOCUMENTS

| | | |
|---|---|---|
| JP | 2015-008169 A | 1/2015 |
| JP | 2016-006834 A | 1/2016 |
| JP | 2017-228683 A | 12/2017 |
| WO | 2019/130746 A1 | 7/2019 |

* cited by examiner

CIRCUIT BOARD MODULE

CROSS-REFERENCE TO RELATED APPLICATIONS

This application claims benefit of priority to International Patent Application No. PCT/JP2020/039759, filed Oct. 22, 2020, and to Japanese Patent Application No. 2020-047122, filed Mar. 18, 2020, the entire contents of each are incorporated herein by reference.

BACKGROUND

Technical Field

The present disclosure relates to a circuit board module that includes a power-supply circuit module and a load to which a large current is supplied by the power-supply circuit module.

BACKGROUND ART

Japanese Unexamined Patent Application Publication No. 2010-141279 describes a circuit component that has a heat-dissipation structure of a circuit element mounted on a circuit board. In the configuration described in Japanese Unexamined Patent Application Publication No. 2010-141279, the circuit element is mounted on a mounting surface of the circuit board. A through hole is formed in the circuit board such that a heat-dissipation portion of the circuit element is exposed through the through hole.

A radiator that includes heat-dissipation fins is mounted on a surface of the circuit board that is opposite to the mounting surface of the circuit board. The radiator includes a projecting portion. The projecting portion is inserted in the through hole so as to be in surface contact with the heat-dissipation portion of the circuit element.

SUMMARY

In general, in order to drive an electrical circuit or a circuit element, a voltage needs to be applied, or a current needs to be supplied. Thus, in a configuration such as that described in Japanese Unexamined Patent Application Publication No. 2010-141279, for example, a power-supply circuit module is mounted on the mounting surface of the circuit board, on which the circuit element is mounted. A voltage from the power-supply circuit module is applied to the circuit element, or a current from the power-supply circuit module is supplied to the circuit element by using a circuit pattern formed on the circuit board.

As such a circuit element, a low-voltage and large-current semiconductor processor has often been put to practical use. For such a semiconductor processor, there has been a demand for further voltage stabilization and an improvement in the efficiency of supply of a large current.

In the above-described configuration, however, it is difficult to achieve voltage stabilization and an improvement in the efficiency of supply of a large current for an element (a load) such as a low-voltage and large-current semiconductor processor.

Accordingly, the present disclosure provides a circuit board module capable of achieving further stabilization of a voltage that is applied to a load and an improvement in the efficiency of supply of a large current to the load.

A circuit board module of the present disclosure includes a first circuit board that has a first main surface on which a power semiconductor device is mounted and a second main surface and that forms a power conversion circuit and a second circuit board having a third main surface and a fourth main surface on which a load that receives a current supplied by the power conversion circuit is mounted in such a manner as to be electrically connected to the fourth main surface. The first circuit board includes a positive output pin of the power conversion circuit and a negative output pin of the power conversion circuit each of which has a shape projecting from the second main surface. The second circuit board has a positive through via and a negative through via each of which has a shape extending between the third main surface and the fourth main surface. The second main surface of the first circuit board and the third main surface of the second circuit board are physically in close contact with each other. The positive output pin is inserted through the positive through via in such a manner as to reach the fourth main surface. The negative output pin is inserted through the negative through via in such a manner as to reach the fourth main surface. The load receives a current supplied from the power conversion circuit through the positive output pin and the negative output pin.

In this configuration, a current is directly supplied to the load from the power conversion circuit, that is, a power-supply circuit module, through the positive output pin and the negative output pin. As a result, loss of a current that is supplied to the load from the power-supply circuit module is suppressed, and stabilization of a voltage that is supplied to the load is achieved. In addition, an improvement in the efficiency of application of the voltage and an improvement in the efficiency of supply of the current are achieved.

According to the present disclosure, stabilization of a voltage that is applied to a load and an improvement in the efficiency of supply of a large current to the load can be achieved, and at the same time, a simple and low-cost power supply interface structure for an element (a load) such as a semiconductor processor that includes a large number of communication ports can be fabricated.

DETAILED DESCRIPTION

First Embodiment

Figure 1:
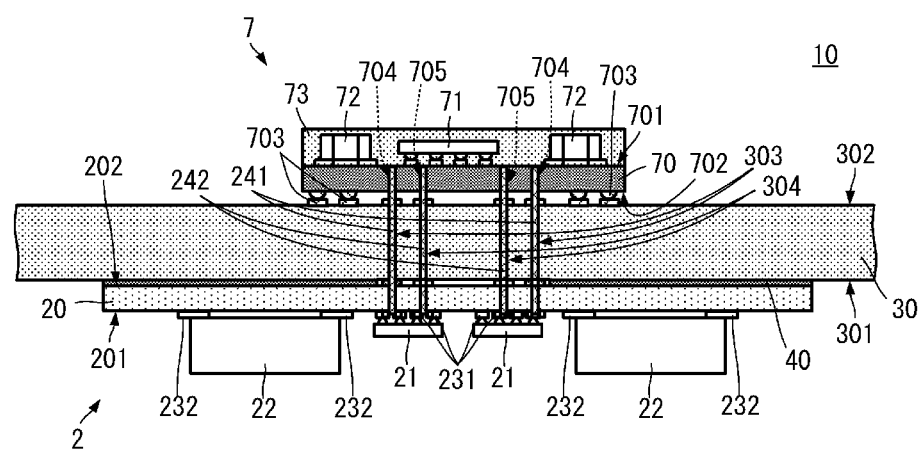
FIG. 1 is a sectional side view illustrating a configuration of a circuit board module according to a first embodiment.
Figure 2:
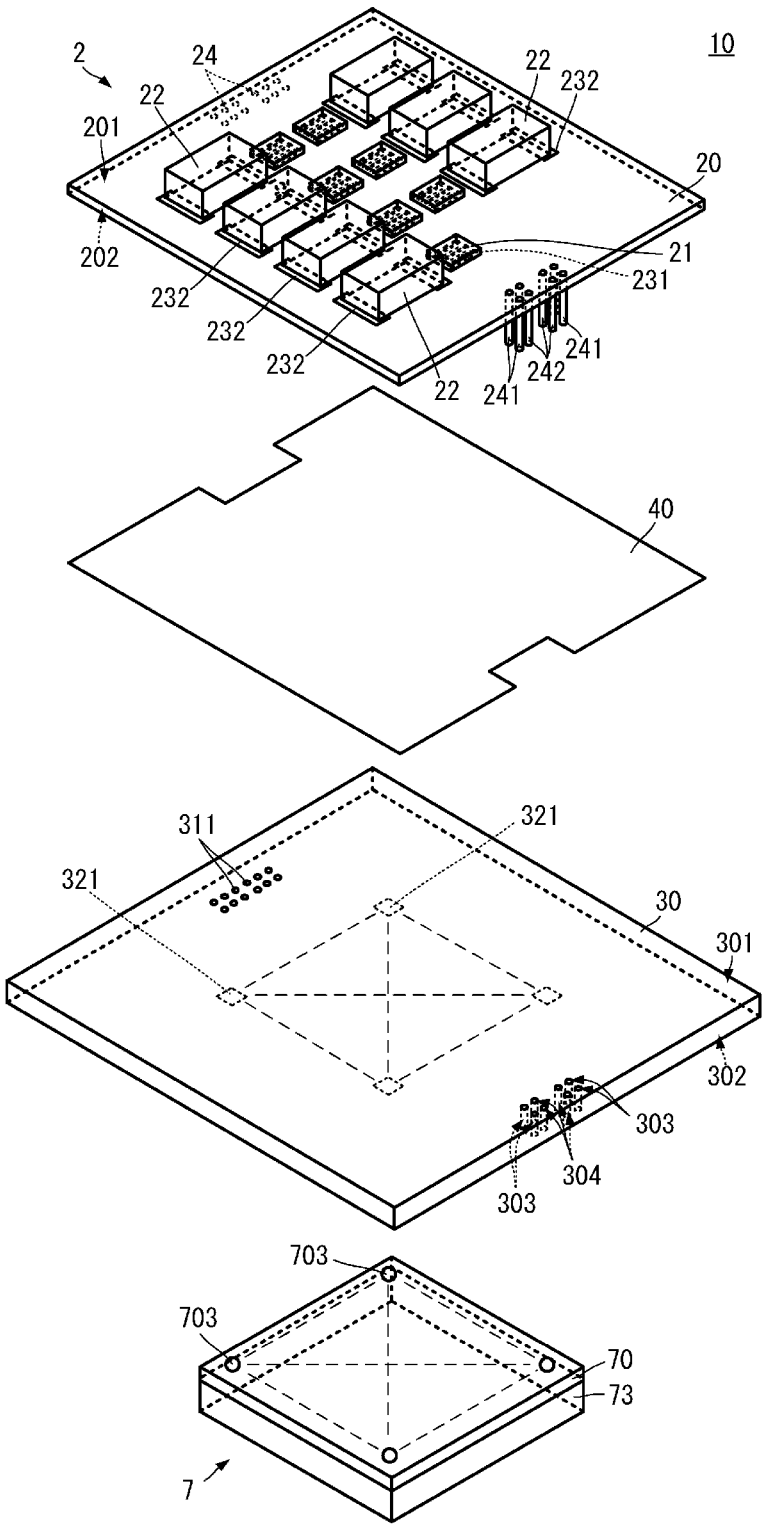
FIG. 2 is an exploded perspective view of the circuit board module according to the first embodiment.
Figure 3A:
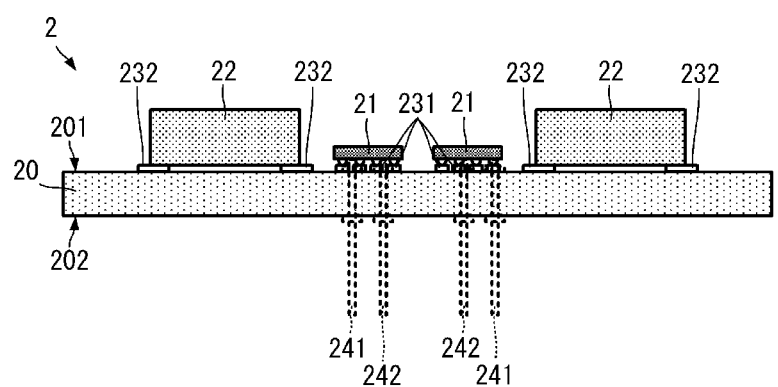
FIG. 3A and FIG. 3B are side views illustrating a configuration of a power-supply circuit module that is included in the circuit board module according to the first embodiment.
Figure 3B:
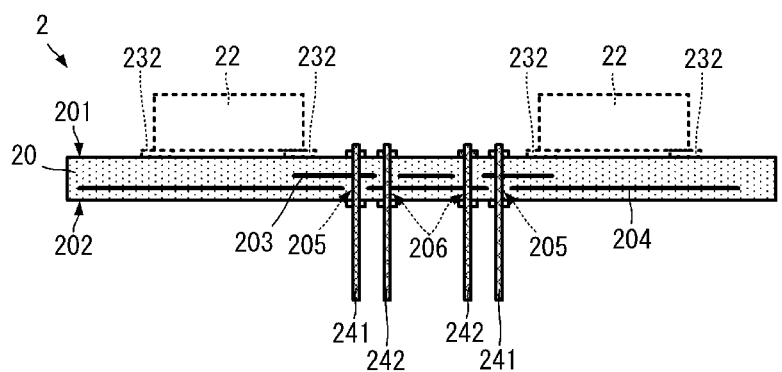
Figure 4:
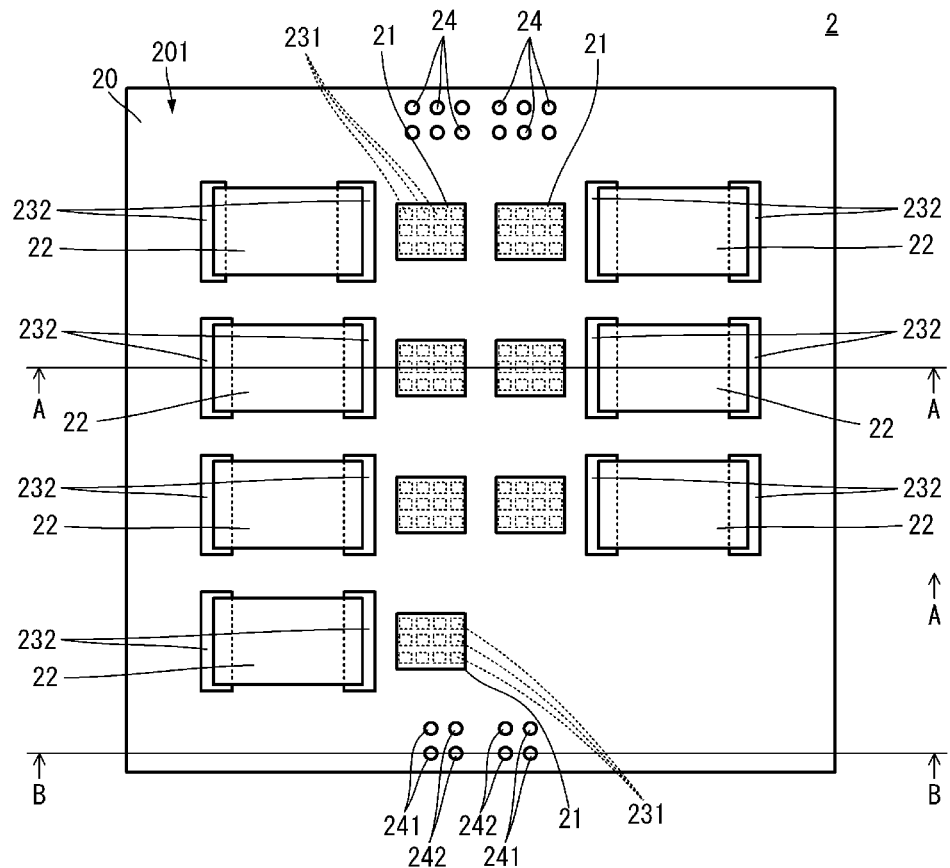
FIG. 4 is a plan view of the power-supply circuit module included in the circuit board module according to the first embodiment.
Figure 5:
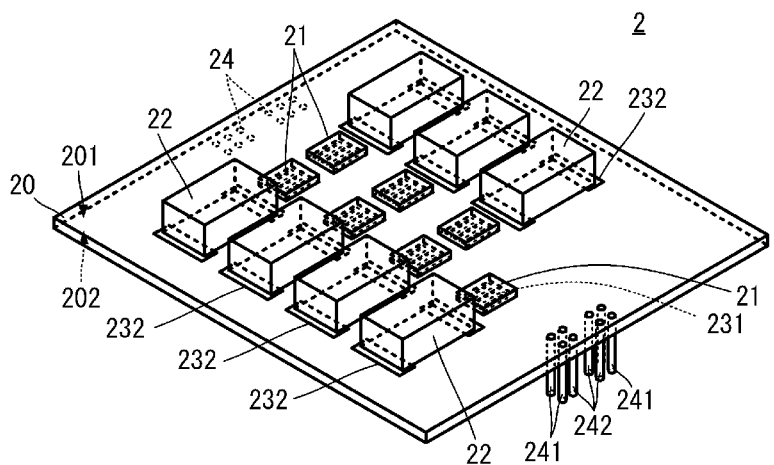
FIG. 5 is an external perspective view of the power-supply circuit module included in the circuit board module according to the first embodiment.

A circuit board module according to a first embodiment of the present disclosure will be described with reference to the drawings. FIG. 1 is a sectional side view illustrating a configuration of the circuit board module according to the first embodiment. FIG. 2 is an exploded perspective view of the circuit board module according to the first embodiment. FIG. 3A and FIG. 3B are side views illustrating a configuration of a power-supply circuit module that is included in the circuit board module according to the first embodiment. FIG. 4 is a plan view of the power-supply circuit module included in the circuit board module according to the first embodiment. FIG. 5 is an external perspective view of the power-supply circuit module included in the circuit board module according to the first embodiment.

FIG. 3A is a schematic sectional view taken along line A-A of FIG. 4, and FIG. 3B is a schematic sectional view taken along line B-B of FIG. 4. In FIG. 1, FIG. 2, FIG. 3A, FIG. 3B, FIG. 4, and FIG. 5, the dimensions of components are emphasized, and some reference signs are not illustrated in order to make the drawings easy to see.

As illustrated in FIG. 1 and FIG. 2, a circuit board module 10 includes a power-supply circuit module 2, a semiconductor device 7, a circuit board 30, and a thermally-conductive sheet 40.

(Configuration of Power-Supply Circuit Module 2)

As illustrated in FIG. 3A, FIG. 3B, FIG. 4, and FIG. 5, the power-supply circuit module 2 includes a circuit board 20, a plurality of switching ICs 21, a plurality of inductors 22, a plurality of external terminal conductors 24, a plurality of positive output pins 241, and a plurality of negative output pins 242. A circuit configuration example of the power-supply circuit module 2 will be described later with reference to FIG. 6 and FIG. 7.

The circuit board 20 is formed of an insulating substrate. The circuit board 20 is a flat plate having a first main surface 201 and a second main surface 202. Although not illustrated in the drawings, a conductor pattern for fabricating the power-supply circuit module 2 is formed on the circuit board 20. The circuit board 20 includes, in its substrate, a positive conductor layer 203 and a negative conductor layer 204. The positive conductor layer 203 and the negative conductor layer 204 are arranged in such a manner as to extend in a direction perpendicular to the thickness direction of the circuit board 20. The positive conductor layer 203 and the negative conductor layer 204 are arranged at different positions in the thickness direction of the circuit board 20. The positive conductor layer 203 and the negative conductor layer 204 are electrically insulated from each other. The circuit board 20 has a plurality of through vias 205 and a plurality of through vias 206. A conductor is formed on the inner wall surface of each of the plurality of through vias 205 so as to be electrically connected to the positive conductor layer 203. A conductor is formed on the inner wall surface of each of the plurality of through vias 206 so as to be electrically connected to the negative conductor layer 204. The circuit board 20 corresponds to a "first circuit board" of the present disclosure.

The plurality of switching ICs 21 and the plurality of inductors 22 are mounted on the first main surface 201 of the circuit board 20.

The plurality of switching ICs 21 are mounted on the circuit board 20 in a predetermined arrangement. The plurality of inductors 22 are mounted on the circuit board 20 in a predetermined arrangement in such a manner as to sandwich the region in which the plurality of switching ICs 21 are arranged. In this case, the plurality of switching ICs 21 and the plurality of inductors 22 are arranged in such a manner that each of the switching ICs 21 and a corresponding one of the inductors 22 forming part of a power converter (see FIG. 6 and FIG. 7, which will be described later) are positioned close to each other.

Each of the plurality of external terminal conductors 24 is, for example, a conductor pattern having a substantially circular shape, a rectangular shape, or the like and is formed on the second main surface 202 of the circuit board 20. When the circuit board 20 is viewed in plan view, the plurality of external terminal conductors 24 are arranged in a region that is different from the regions in which the plurality of switching ICs 21 and the plurality of inductors 22 are arranged. For example, the plurality of external terminal conductors 24 are arranged in a predetermined pattern in the vicinity of a side surface of the circuit board 20. The plurality of external terminal conductors 24 form terminals excluding an output terminal Pout (see FIG. 6, which will be described later) of the power-supply circuit module 2.

The plurality of positive output pins 241 and the plurality of negative output pins 242 are bar-shaped members each having electrical conductivity. By suitably setting the shapes of the cross-sectional areas or the like of the plurality of positive output pins 241 and the plurality of negative output pins 242, the plurality of positive output pins 241 and the plurality of negative output pins 242 may each have a resistance lower than that of each of the conductor patterns formed on the circuit board 20 and the circuit board 30.

The plurality of positive output pins 241 and the plurality of negative output pins 242 are arranged on the circuit board 20 in such a manner that each of the plurality of positive output pins 241 and a corresponding one of the plurality of negative output pins 242 are paired with each other. The pairs of the plurality of positive output pins 241 and the plurality of negative output pins 242 form the output terminal Pout of the power-supply circuit module 2.

The plurality of positive output pins 241 are inserted in the plurality of through vias 205 and fixed to the circuit board 20. In this case, the plurality of positive output pins 241 are fixed to the circuit board 20 in such a manner as to project from the second main surface 202 by a predetermined length. Each of the plurality of positive output pins 241 is connected to the conductor formed on the inner wall surface of one of the plurality of through vias 205. As a result, the plurality of positive output pins 241 are electrically connected to the positive conductor layer 203 of the circuit board 20.

The plurality of negative output pins 242 are inserted in the plurality of through vias 206 and fixed to the circuit board 20. In this case, the plurality of negative output pins 242 are fixed to the circuit board 20 in such a manner as to project from the second main surface 202 by a predetermined length. Each of the plurality of negative output pins 242 is connected to the conductor formed on the inner wall surface of one of the plurality of through vias 206. As a result, the plurality of negative output pins 242 are electrically connected to the negative conductor layer 204 of the circuit board 20.

(Configuration of Circuit Board 30)

The circuit board 30 is formed of an insulating substrate, and a predetermined conductor pattern is formed on the circuit board 30. The circuit board 30 is a flat plate having a third main surface 301 and a fourth main surface 302. The circuit board 30 is, for example, a motherboard of an electronic device such as a personal computer. The planar area of the circuit board 30 is larger than the planar area of the circuit board 20, and it is preferable that the planar area of the circuit board 30 be significantly than the planar area of the circuit board 20. The circuit board 30 corresponds to a "second circuit board" of the present disclosure.

A plurality of land conductors 311 are formed on the third main surface 301 of the circuit board 30. A plurality of land conductors 321 are formed on the fourth main surface 302 of the circuit board 30. A plurality of through vias 303 and a plurality of through vias 304 are formed in the circuit board 30. The plurality of through vias 303 and the plurality of through vias 304 each extend between the third main surface 301 and the fourth main surface 302 of the circuit board 30. Each of the through vias 303 corresponds to a "positive through via" of the present disclosure, and each of the through vias 304 corresponds to a "negative through via" of the present disclosure.

(Configuration of Semiconductor Device 7)

The semiconductor device 7 includes a base substrate 70, a semiconductor IC 71, a plurality of passive elements 72, and a mold resin member 73.

The base substrate 70 is made of an insulating material and is a flat plate having a main surface 701 and a main surface 702. Although not illustrated in the drawings, a conductor pattern forming the semiconductor device 7 is formed on the base substrate 70. A plurality of positive through vias 704 and a plurality of negative through vias 705 are formed in the base substrate 70. The plurality of positive through vias 704 and the plurality of negative through vias 705 are each provided with a conductor formed on the inner wall surface thereof. The conductors on the inner wall surfaces of the plurality of positive through vias 704 and the conductors on the inner wall surfaces of the plurality of negative through vias 705 are connected to the conductor pattern formed on the base substrate 70 by a predetermined connection pattern.

The semiconductor IC 71 and the plurality of passive elements 72 are mounted on the main surface 701 of the base substrate 70. The mold resin member 73 is formed on the main surface 701 of the base substrate 70 so as to cover the semiconductor IC 71 and the plurality of passive elements 72. A plurality of terminal conductors 703 are arranged on the main surface 702 of the base substrate 70. The semiconductor IC 71 is, for example, a power semiconductor.

(Configuration of Thermally-Conductive Sheet 40)

The thermally-conductive sheet 40 is a film having a high thermal conductivity. It is preferable that the thermally-conductive sheet 40 have flexibility. The area of the thermally-conductive sheet 40 is approximately the same as the area of the circuit board 20 (the area of the second main surface 202).

The thermally-conductive sheet 40 is formed of, for example, a graphite sheet or a silicone sheet. The thermally-conductive sheet 40 corresponds to a "first thermally-conductive sheet" of the present disclosure. Note that, in the case of using a graphite sheet, it is preferable to use a graphite sheet having a thermal conductivity higher than that of a metal. This further improves a heat dissipation efficiency, which will be described later.

(Configuration of Circuit Board Module 10)

The power-supply circuit module 2 is disposed with respect to the circuit board 30 in such a manner that the second main surface 202 faces the third main surface 301 of the circuit board 30. The plurality of external terminal conductors 24 of the circuit board 20 are joined to the plurality of land conductors 311 of the circuit board 30 with a conductive joining material such as solder. As a result, the power-supply circuit module 2 and the circuit board 30 are electrically and physically joined to each other.

The semiconductor device 7 is mounted on the fourth main surface 302 of the circuit board 30. The plurality of terminal conductors 703 of the semiconductor device 7 are joined to the plurality of land conductors 321 of the circuit board 30 with a conductive joining material such as solder. As a result, the semiconductor device 7 and the circuit board 30 are electrically and physically joined to each other.

The power-supply circuit module 2 and the semiconductor device 7 overlap each other when the circuit board module 10 is viewed in plan view.

The plurality of positive output pins 241 of the circuit board 20 are inserted through the plurality of through vias 303 of the circuit board 30. The plurality of positive output pins 241 also project from the fourth main surface 302 of the circuit board 30 and are inserted in the plurality of positive through vias 704 formed in the semiconductor device 7. The plurality of positive output pins 241 are connected to the conductors formed on the inner wall surfaces of the plurality of positive through vias 704.

The plurality of negative output pins 242 of the circuit board 20 are inserted through the plurality of through vias 304 of the circuit board 30. The plurality of negative output pins 242 also project from the fourth main surface 302 of the circuit board 30 and are inserted in the plurality of negative through vias 705 formed in the semiconductor device 7. The plurality of negative output pins 242 are connected to the conductors formed on the inner wall surfaces of the plurality of negative through vias 705.

As a result, the power-supply circuit module 2 and the semiconductor device 7 are electrically connected to each other.

The thermally-conductive sheet 40 is disposed between the circuit board 20 and the circuit board 30 and is in surface contact with the circuit board 20 and the circuit board 30.

With such a configuration, the semiconductor device 7 receives a current supplied by the power-supply circuit module 2 only through the plurality of positive output pins 241 and the plurality of negative output pins 242. In other words, the current can be supplied to the semiconductor device 7 by the power-supply circuit module 2 without passing through the circuit board 30.

Here, the plurality of positive output pins 241 and the plurality of negative output pins 242 each have a resistance lower than that of the conductor pattern formed on the circuit board 30. Thus, a current supply path extending from the power-supply circuit module 2 to the semiconductor device 7 has a low resistance. As a result, the circuit board module 10 can achieve stabilization of a voltage that is applied to the semiconductor device 7, highly efficient application of the voltage to the semiconductor device 7, and highly efficient supply of a current to the semiconductor device 7. In addition, by using such a current supply path having a low resistance, the circuit board module 10 can stabilize, with high accuracy, the voltage that is supplied to the semiconductor device 7 even in the case where current consumption of the semiconductor device 7 changes.

In the configuration of the circuit board module 10, the power-supply circuit module 2 and the semiconductor device 7 overlap each other when viewed in plan view. Thus, the plurality of positive output pins 241 and the plurality of negative output pins 242 can each be formed linearly, and the length thereof can be reduced. Thus, the power-supply circuit module 2 and the semiconductor device 7 can be connected to each other by the shortest distance, and a loss in the current supply path extending from the power-supply circuit module 2 to the semiconductor device 7 can be further reduced. As a result, the circuit board module 10 can achieve further stabilization of the voltage that is applied to the semiconductor device 7, further highly efficient application of the voltage to the semiconductor device 7, and further highly efficient supply of a current to the semiconductor device 7 and can further improve the accuracy of the voltage to be applied.

In the power-supply circuit module 2 having the above-described configuration, the positive conductor layer 203 and the negative conductor layer 204 are formed at different layers of the circuit board 20. This increases the degree of freedom regarding the shapes of the positive conductor layer 203 and the negative conductor layer 204. Thus, the degree of freedom regarding the arrangement of the plurality of positive output pins 241 and the plurality of negative output pins 242 increases. In other words, the power-supply circuit module 2 having a large degree of freedom in design can be constructed while obtaining the above-mentioned advantageous effect.

In the power-supply circuit module 2 having the above-described configuration, the power-supply circuit module 2 can be constructed not in a three-dimensional shape but in a two-dimensional shape. As a result, the height of the circuit board module 10 is reduced. In addition, the planar area of the power-supply circuit module 2 becomes large, and a heat dissipation effect is improved.

With such a configuration, the circuit board module 10 can transfer heat generated by the plurality of switching ICs 21 and the inductors 22 of the power-supply circuit module 2 to the circuit board 30 through the substrate forming the circuit board 20, a circuit conductor pattern, and the thermally-conductive sheet 40. Since the area of the circuit board 30 is larger than that of the circuit board 20, the transferred heat is effectively dissipated.

By employing the above-described configuration, the circuit board module 10 can effectively dissipate heat generated by the power-supply circuit module 2. In addition, the circuit board module 10 does not use a heat-dissipation fin such as that included in a configuration of the related art, and thus, reduction in the height of the circuit board module 10 can be achieved. In other words, the circuit board module 10 can have a favorable heat-dissipation performance and can be reduced in height.

In the above-described configuration, in the case where the thermally-conductive sheet 40 has flexibility, the thermally-conductive sheet 40 may be sandwiched between the circuit board 20 and the circuit board 30 such that a predetermined pressure is applied to the thermally-conductive sheet 40. As a result, the degree of close contact between the thermally-conductive sheet 40 and the circuit board 20 and the degree of close contact between the thermally-conductive sheet 40 and the circuit board 30 are improved. Consequently, the circuit board module 10 can have a higher heat-dissipation performance.

A silicone sheet may be used as the thermally-conductive sheet 40 in order to prevent an unnecessary short-circuit between the circuit board 20 and the circuit board 30. In this case, an insulating resist film that is provided at a portion of the second main surface 202 of the circuit board 20 and a portion of the third main surface 301 of the circuit board 30, the portions facing each other, can be omitted. Even in an aspect in which such an insulating resist film is provided, an unnecessary short-circuit can be further reliably prevented from occurring between the circuit board 20 and the circuit board 30.

On the other hand, when it is not necessary to prevent such a short-circuit, and it is desired to actively bring the thermally-conductive sheet 40 into conduction as in another embodiment, which will be described later, a graphite sheet may be used as the thermally-conductive sheet 40. In the case of using a graphite sheet, an unnecessary short-circuit can be prevented from occurring between the circuit board 20 and the circuit board 30 by providing an insulating resist film at required positions on the portion of the second main surface 202 of the circuit board 20 and the portion of the third main surface 301 of the circuit board 30, the portions facing each other.

The thermally-conductive sheet 40 is not located in the region of the circuit board 20 in which the plurality of external terminal conductors 24 are formed. As a result, the possibility of an occurrence of an unnecessary short-circuit can be reduced by using an electrically conductive sheet (e.g., a graphite sheet) as the thermally-conductive sheet 40, and the possibility of an occurrence of breakage of wiring lines can be reduced by using an insulating sheet (e.g., a silicone sheet) as the thermally-conductive sheet 40.

(Example of Suitable Power-Supply Circuit Module)

Figure 6:
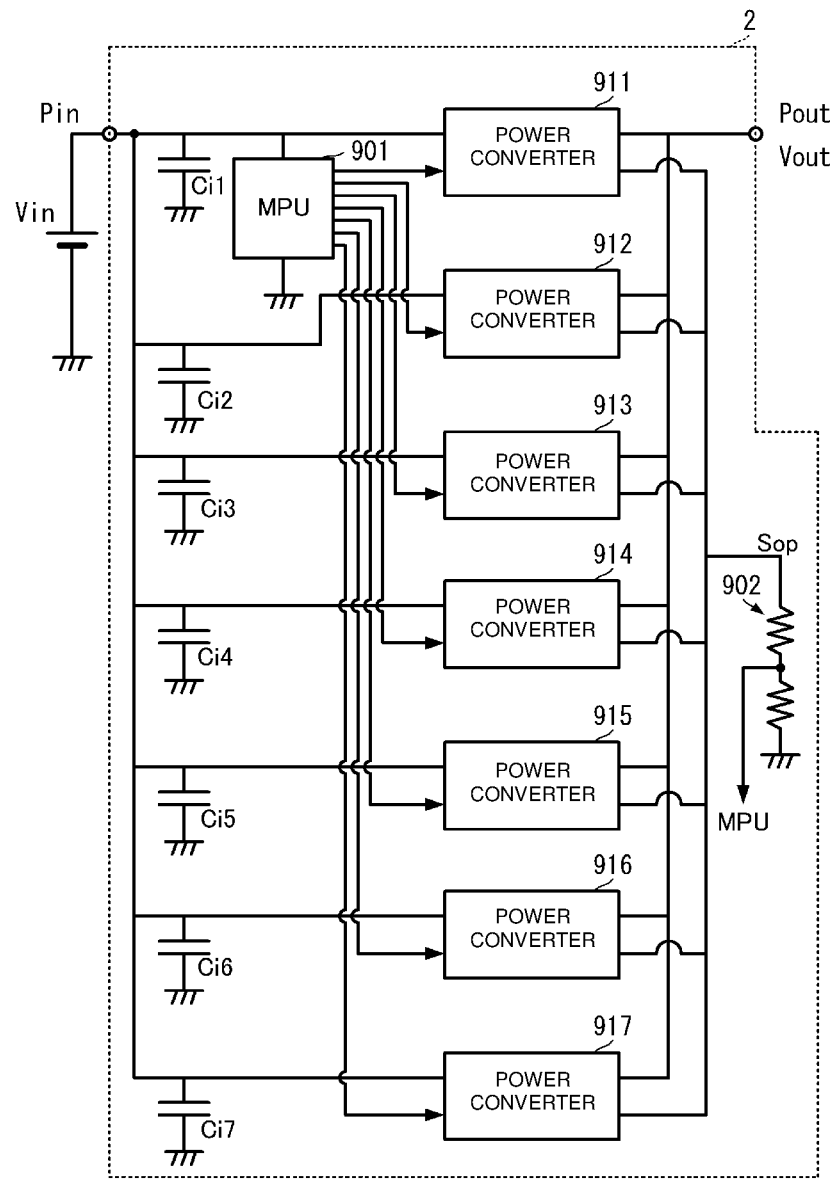
FIG. 6 is an equivalent circuit diagram illustrating, in a simplified manner, the power-supply circuit module according to the first embodiment.
Figure 7:
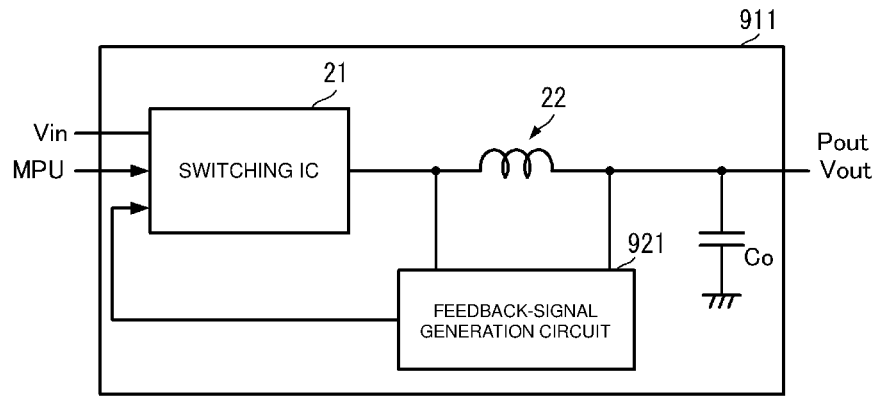
FIG. 7 is an equivalent circuit diagram illustrating a simplified configuration of a power converter of the power-supply circuit module illustrated in FIG. 6.

The power-supply circuit module 2 of the circuit board module 10 having a configuration such as that described above forms, for example, a multi-cell converter such as that illustrated in FIG. 6 and FIG. 7. FIG. 6 is an equivalent circuit diagram illustrating, in a simplified manner, the power-supply circuit module according to the first embodiment. FIG. 7 is an equivalent circuit diagram illustrating a simplified configuration of a power converter of the power-supply circuit module illustrated in FIG. 6. Note that descriptions of the specific configuration and the operation of the power-supply circuit module will be omitted.

As illustrated in FIG. 6, the power-supply circuit module 2 includes an MPU 901, a plurality of power converters 911 to 917, a voltage detection circuit 902, and a plurality of input capacitors Ci1 to Ci7. The plurality of power converters 911 to 917 are connected to an input terminal Pin and receives an input voltage Vi from the outside. The input capacitors Ci1 to Ci7 are connected to input ends of the plurality of power converters 911 to 917, respectively. The plurality of power converters 911 to 917 are connected to the output terminal Pout.

The MPU 901 is connected to the input terminal Pin and receives the input voltage Vi. The MPU 901 is connected to the plurality of power converters 911 to 917.

The voltage detection circuit 902 is connected to the plurality of power converters 911 to 917, and a voltage that is detected by the voltage detection circuit 902 is applied to the MPU 901.

The MPU 901 is driven by a drive voltage that is obtained from the input voltage Vi and controls switching of the plurality of power converters 911 to 917 on and off on the basis of the voltage detected by the voltage detection circuit 902. In other words, the MPU 901 controls the number of power converters that are caused to operate in the plurality of power converters 911 to 917 in accordance with the state of a load that is connected to the output terminal Pout. More specifically, for example, when it is desired to increase the current supplied to the load, the MPU 901 increases the number of power converters that are caused to operate, and when the current supplied to the load is excessive, the MPU 901 reduces the number of power converters that are caused to operate.

As a result, the power-supply circuit module 2 can supply the current in accordance with the state of the load. In addition, in this configuration, the plurality of power converters 911 to 917 are connected in parallel with respect to the load, so that the power-supply circuit module 2 can supply a large current to the load with a low voltage.

In such a configuration, the plurality of power converters 911 to 917 have the same configuration that is schematically illustrated in FIG. 7. Note that the power converter 911 will be described below as an example with reference to FIG. 7.

The power converter 911 includes one of the switching ICs 21, one of the inductors 22, a feedback-signal generation circuit 921, and the output capacitor Co.

The switching IC 21 includes a plurality of switching elements and a controller for the switching elements therein. Each of the switching IC 21 operates in response to the MPU 901 performing control for switching on the switching IC 21 and stops its operating in response to the MPU 901 performing control for switching off the switching IC 21.

The switching IC 21 is connected to the inductor 22, and the inductor 22 is connected to the output terminal Pout. The output capacitor Co is connected to the output-terminal-Pout side of the inductor 22. The feedback-signal generation circuit 921 generates a feedback signal according to an output current and an output voltage and applies the feedback signal to the switching IC 21.

The switching IC 21 controls the output current and the output voltage on the basis of the feedback signal.

In this configuration, the switching IC 21 switches the plurality of switching elements on and off at high speed. This causes the switching IC 21 to generate heat. In other words, the switching IC 21 corresponds to an "electronic device that generates heat when it operates" of the present application. Thus, the configuration of the circuit board module 10 of the present application is more effective.

As described above, the plurality of power converters 911 to 917 supply a large current, and thus, heat that is generated by the switching ICs 21 and the inductors 22 due to the current is also likely to be large.

By using the power-supply circuit module 2 that forms such a multi-cell converter, even if the semiconductor device 7 is a load whose consumption current is switched, the power-supply circuit module 2 can stably supply a consumption current that the semiconductor device 7 requires by switching it at high speed. In addition, by employing the above-described configuration, the circuit board module 10 can achieve stabilization of the voltage that is applied to the semiconductor device 7 from the power-supply circuit module 2, highly efficient application of the voltage to the semiconductor device 7, and highly efficient supply of a current to the semiconductor device 7.

(Derivative Example of Circuit Board Module According to First Embodiment)

Figure 8:
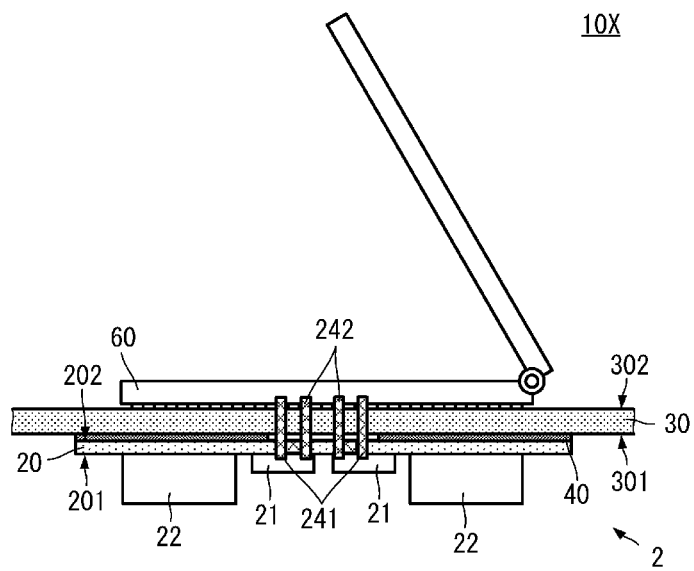
FIG. 8 is a sectional side view illustrating a configuration of a derivative example of the circuit board module according to the first embodiment.

In the above configuration, the semiconductor device 7 mounted on the circuit board 30 has been described as an example of a load. However, the above-described configuration can also be applied to a circuit board module having a configuration such as that described below. FIG. 8 is a sectional side view illustrating a configuration of a derivative example of the circuit board module according to the first embodiment.

As illustrated in FIG. 8, a circuit board module 10X of the derivative example includes a socket 60 instead of the semiconductor device 7. The socket 60 is mounted on the fourth main surface 302 of the circuit board 30. The socket 60 overlaps the circuit board 20 when viewed in plan view. The socket 60 may have has a function of serving as a radiator.

A semiconductor device for data processing such as a CPU, a GPU, or an MPU is attached to the socket 60. The semiconductor device attached to the socket 60 is driven by receiving power supplied by a power-supply circuit module that is fabricated by the circuit board 20 (e.g., the above-described power-supply circuit module 2 illustrated in FIG. 6 and FIG. 7). In this case, the plurality of positive output pins 241 and the plurality of negative output pins 242 of the power-supply circuit module 2 are connected to the socket 60.

Most of CPUs, GPUs, MPUs, and the like have specifications that require a low voltage and a large current, and in the case of using such a semiconductor device, as mentioned above, stable voltage supply is required. However, by employing the configuration illustrated in FIG. 8, the circuit board module 10X can apply a stable voltage to the CPU, the MPU, or the like attached to the socket 60 and can achieve highly efficient application of the voltage to the CPU, the GPU, the MPU, or the like, and highly efficient supply of a current to the CPU, the GPU, the MPU, or the like.

The amount of heat generated by the power-supply circuit module 2 is likely to be large. However, by employing the configuration of the circuit board module 10X as described above, effective heat dissipation can be performed.

In addition, in this configuration, the power-supply circuit module 2 having a planar shape is used, and heat dissipation using the thermally-conductive sheet 41 is performed. A heat sink such as that of the related art is not used. As a result, the height of the circuit board module 10X can be reduced.

Second Embodiment

Figure 9:
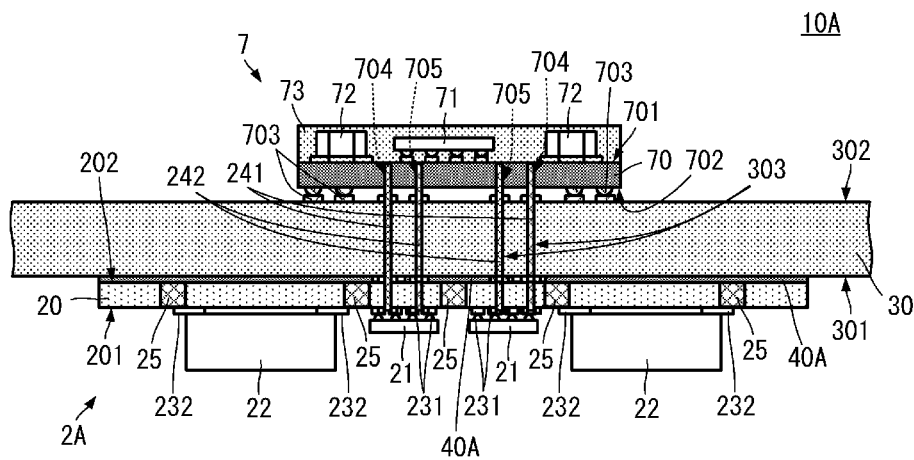
FIG. 9 is a sectional side view illustrating a configuration of a circuit board module according to a second embodiment.

A circuit board module according to the second embodiment of the present disclosure will now be described with reference to the drawings. FIG. 9 is a sectional side view illustrating the configuration of the circuit board module according to the second embodiment.

As illustrated in FIG. 9, the differences between a circuit board module 10A according to the second embodiment and the circuit board module 10 according to the first embodiment are the configuration of a power-supply circuit module 2A and the configuration of a thermally-conductive sheet 40A. The rest of the configuration of the circuit board module 10 is similar to that of the circuit board module 10A, and the descriptions of similar portions will be omitted.

The power-supply circuit module 2A includes a plurality of thermally-conductive vias 25 formed in the circuit board 20. The plurality of thermally-conductive vias 25 each extend between the first main surface 201 and the second main surface 202 of the circuit board 20. The plurality of thermally-conductive vias 25 are made of a material having a high thermal conductivity such as a predetermined metal or the like. More specifically, the plurality of thermally-conductive vias 25 can be obtained by placing a thermally-conductive member having a high thermal conductivity into the through holes extending between the first main surface 201 and the second main surface 202 of the circuit board 20.

For example, the plurality of thermally-conductive vias 25 are formed separately from via conductors for fabricating a circuit on the circuit board 20. It is preferable that each of the plurality of thermally-conductive vias 25 have a cross-sectional area larger than that of each of the via conductors for fabricating a circuit.

The plurality of thermally-conductive vias 25 are formed in the vicinity of mounting terminals (conductor patterns) on which the plurality of switching ICs 21 are mounted. In addition, the plurality of thermally-conductive vias 25 are formed in the vicinity of mounting terminals (conductor patterns) on which the plurality of inductors 22 are mounted.

The circuit board module 10A includes the plurality of thermally-conductive vias 25 as mentioned above, so that the circuit board module 10A can more effectively transfer the heat generated by the plurality of switching ICs 21 and the inductors 22 to the thermally-conductive sheet 40A. The thermally-conductive sheet 40A is larger than the total area of the plurality of thermally-conductive vias 25 and larger than the area in which the plurality of switching ICs 21 and the plurality of inductors 22 are arranged, and thus, the thermally-conductive sheet 40A can further diffuse the heat, which is transferred thereto, in a planar manner and transfer the heat to the circuit board 30. The heat is further diffused by the circuit board 30 having a larger area than the thermally-conductive sheet 40A, and more efficient heat dissipation can be achieved.

The above-mentioned member having electrical conductivity such as a graphite sheet is used as the thermally-conductive sheet 40A so as to be connected to the plurality of negative output pins 242. As a result, the negative output pins 242 and the thermally-conductive sheet 40A have the same potential.

In this configuration, the thermally-conductive sheet 40A functions as a noise blocking film. As a result, the circuit board module 10A can reduce the possibility that noise that is generated by the plurality of switching ICs 21 will propagate to the circuit board 30 and the semiconductor device 7.

In particular, in this configuration, the thermally-conductive sheet 40A has a shape extending over substantially the entire surface of the circuit board 20, and thus, the circuit board module 10A can block noise over a wide area.

Third Embodiment

Figure 10:
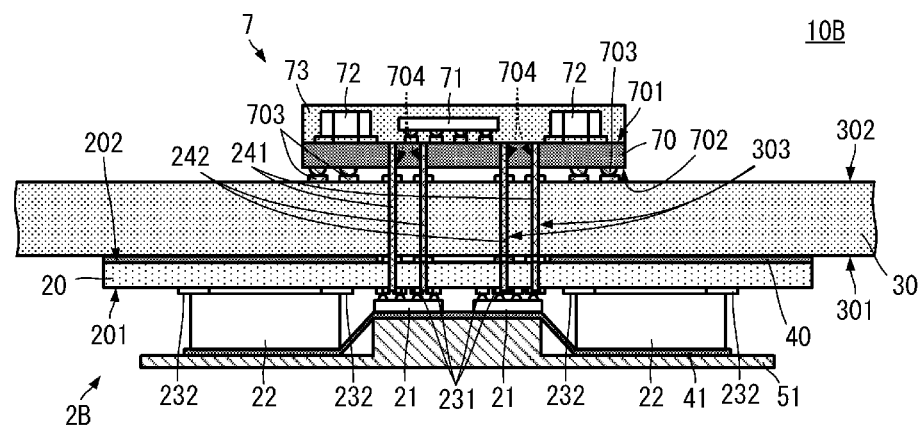
FIG. 10 is a sectional side view of a circuit board module according to a third embodiment.

A circuit board module according to a third embodiment of the present disclosure will now be described with reference to the drawings. FIG. 10 is a sectional side view of the circuit board module according to the third embodiment.

As illustrated in FIG. 10, a circuit board module 10B according to the third embodiment is different from the circuit board module 10 according to the first embodiment in that the circuit board module 10B further includes a thermally-conductive sheet 41 and a heat sink 51. The rest of the configuration of the circuit board module 10B is similar to that of the circuit board module 10, and the descriptions of similar portions will be omitted.

The circuit board module 10B includes the thermally-conductive sheet 41 and the heat sink 51. The thermally-conductive sheet 41 is an insulating sheet made of a silicone rubber or the like. The thermally-conductive sheet 41 is in contact with surfaces of the plurality of switching ICs 21 that are opposite to the mounting surfaces of the plurality of switching ICs 21 and surfaces of the plurality of inductors 22 that are opposite to the mounting surfaces of the plurality of inductors 22. The heat sink 51 is in contact with a surface of the thermally-conductive sheet 41, the surface being opposite to the surface of the thermally-conductive sheet 41 that is in contact with the plurality of switching ICs 21 and the plurality of inductors 22. The thermally-conductive sheet 41 corresponds to a "second thermally-conductive sheet" of the present disclosure.

With such a configuration, the circuit board module 10B can transfer heat to the circuit board 30 through the thermally-conductive sheet 40 and also can dissipate heat through the heat sink 51.

Note that it is preferable that the area of the heat sink 51 be larger than the sum of the total area of the plurality of switching ICs 21 and the total area of the plurality of inductors 22. As a result, the heat dissipation efficiency is further improved.

(Derivative Example of Circuit Board Module According to Third Embodiment)

Figure 11:
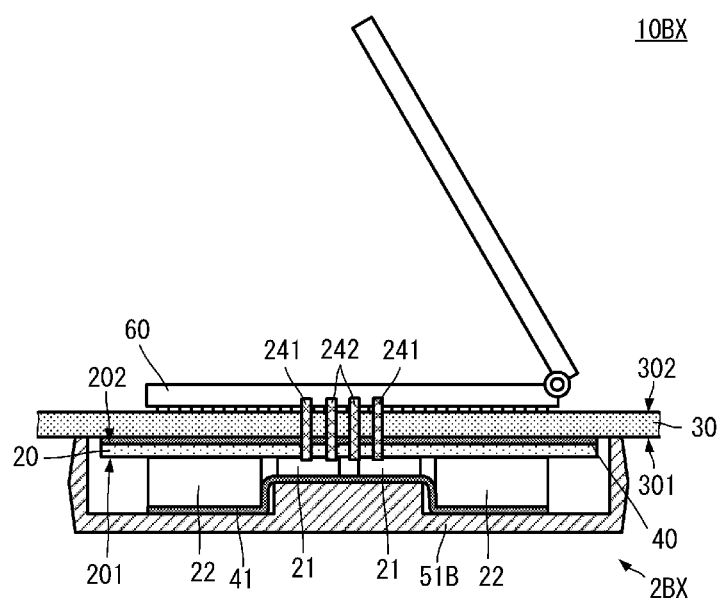
FIG. 11 is a sectional side view illustrating a configuration of a derivative example of the circuit board module according to the third embodiment.

The circuit board module 10B having such a configuration can be applied to, for example, an electronic device such as that partially illustrated in FIG. 11. FIG. 11 is a sectional side view illustrating a configuration of a derivative example of the circuit board module according to the third embodiment.

A circuit board module 10BX illustrated in FIG. 11 is different from the circuit board module 10X of the first embodiment illustrated in FIG. 8 in that the circuit board module 10BX includes a back plate 51B for a socket and the above-mentioned thermally-conductive sheet 41. The rest of the configuration of the circuit board module 10BX illustrated in FIG. 11 is similar to that of the circuit board module 10X illustrated in FIG. 8, and the descriptions of similar portions will be omitted.

The back plate 51B is fixed to the third main surface 301 of the circuit board 30. The back plate 51B is disposed in such a manner as to surround the power-supply circuit module 2. The back plate 51B is in contact with the plurality of switching ICs 21 and the plurality of inductors 22 with the thermally-conductive sheet 41 interposed therebetween. The back plate 51B is made of a thermally-conductive material similar to the material of the above-mentioned heat sink 51.

With such a configuration, the circuit board module 10BX illustrated in FIG. 11 can dissipate heat by also using the back plate 51B. In addition, since the back plate 51B is fixed to the circuit board 30, heat can also be transferred to the circuit board 30 from the back plate 51B, so that more effective heat dissipation can be performed.

Note that, in the above description, although the semiconductor device 7, a CPU, a GPU, a MPU, or the like has been described as an example of a load to which a current is supplied from a power-supply circuit module, the type of the load is not limited to these.

The configurations in the above-described embodiments can be suitably combined, and each combination can provide an advantageous effect.

What is claimed is:

1. A circuit board module comprising:
    a first circuit board that has a first main surface on which a power semiconductor device is mounted and a second main surface and that configures a power conversion circuit; and
    a second circuit board having a third main surface and a fourth main surface on which is mounted a load that is configured to receive a current supplied by the power conversion circuit and is electrically connected to the fourth main surface,
    wherein
    the first circuit board includes a positive output pin of the power conversion circuit and a negative output pin of the power conversion circuit, each of which has a shape projecting from the second main surface, the second circuit board has a positive through via and a negative through via, each of which has a shape extending between the third main surface and the fourth main surface, the second main surface of the first circuit board and the third main surface of the second circuit board are physically in proximate contact with each other, the positive output pin is inserted through the positive through via in such a manner as to reach the fourth main surface, the negative output pin is inserted through the negative through via in such a manner as to reach the fourth main surface, and the load is configured to receive the current supplied from the power conversion circuit through the positive output pin and the negative output pin.

2. The circuit board module according to claim 1, further comprising:
a first thermally-conductive sheet that is between the first circuit board and the second circuit board,
wherein the second main surface of the first circuit board and the third main surface of the second circuit board are in proximate contact with each other physically and thermally with the first thermally-conductive sheet interposed between the second main surface and the third main surface.

3. The circuit board module according to claim 1, wherein the first thermally-conductive sheet has an electrical insulating property, and
the second main surface of the first circuit board and the third main surface of the second circuit board are electrically insulated from each other.

4. The circuit board module according to claim 2, wherein the first thermally-conductive sheet has electrical conductivity, and
the first thermally-conductive sheet is electrically connected to the negative through via and the negative output pin and electrically insulated from the positive through via and the positive output pin.

5. The circuit board module according to claim 2, wherein the first thermally-conductive sheet has flexibility.

6. The circuit board module according to claim 2, wherein the first thermally-conductive sheet has an area larger than an area of the first circuit board.

7. The circuit board module according to claim 4, wherein the first thermally-conductive sheet contains graphite that has a thermal conductivity higher than a thermal conductivity of a metal.

8. The circuit board module according to claim 3, wherein the first thermally-conductive sheet contains a silicone.

9. The circuit board module according to claim 1, wherein the first circuit board and the load overlap each other when viewed in plan view.

10. The circuit board module according to claim 1, further comprising:
a second thermally-conductive sheet that is on the first main surface and that is in contact with the power semiconductor device in such a manner as to cover the power semiconductor device; and
a heat sink that is in contact with the second thermally-conductive sheet in a planar manner.

11. The circuit board module according to claim 10, further comprising:
a radiator that is on the fourth main surface of the second circuit board and that dissipates heat generated by the load.

12. The circuit board module according to claim 1, wherein
the load includes at least one of a CPU, a GPU, and an MPU.

13. The circuit board module according to claim 2, wherein
the first thermally-conductive sheet has an electrical insulating property, and
the second main surface of the first circuit board and the third main surface of the second circuit board are electrically insulated from each other.

14. The circuit board module according to claim 3, wherein
the first thermally-conductive sheet has flexibility.

15. The circuit board module according to claim 4, wherein
the first thermally-conductive sheet has flexibility.

16. The circuit board module according to claim 3, wherein
the first thermally-conductive sheet has an area larger than an area of the first circuit board.

17. The circuit board module according to claim 4, wherein
the first thermally-conductive sheet has an area larger than an area of the first circuit board.

18. The circuit board module according to claim 2, wherein
the first circuit board and the load overlap each other when viewed in plan view.

19. The circuit board module according to claim 2, further comprising:
a second thermally-conductive sheet that is on the first main surface and that is in contact with the power semiconductor device in such a manner as to cover the power semiconductor device; and
a heat sink that is in contact with the second thermally-conductive sheet in a planar manner.

20. The circuit board module according to claim 2, wherein
the load includes at least one of a CPU, a GPU, and an MPU.

* * * * *